United States Patent [19]
Boaz et al.

[11] Patent Number: 6,137,709
[45] Date of Patent: *Oct. 24, 2000

[54] SMALL OUTLINE MEMORY MODULE

[75] Inventors: Ted L. Boaz, Beaverton, Oreg.;
Christopher S. Moore, Campbell, Calif.; Raviprakash Nagaraj, Hillsboro, Oreg.

[73] Assignee: Intel Corporation, Santa Clara, Calif.

[*] Notice: This patent is subject to a terminal disclaimer.

[21] Appl. No.: 09/499,084

[22] Filed: Feb. 4, 2000

Related U.S. Application Data

[63] Continuation of application No. 09/221,804, Dec. 29, 1998, Pat. No. 6,061,263.

[51] Int. Cl.$^7$ .................................................. G11C 13/00
[52] U.S. Cl. .............................................. 365/51; 365/52
[58] Field of Search ........................... 365/189.01, 51, 365/52

[56] References Cited

U.S. PATENT DOCUMENTS 3,142,047   7/1964   Henderson ................................ 365/51
6,061,263   5/2000   Boaz et al. ................................ 365/51

*Primary Examiner*—Terrell W. Fears
*Attorney, Agent, or Firm*—Trop, Pruner & Hu, P.C.

[57] ABSTRACT

A Rambus in-line memory module may be adapted for the smaller board size used for example with portable computers. By using wrong-way routing, the routing can be achieved in a small size while matching impedance between the routings. By grouping signals on one side of the module's printed circuit board and ground and power supplies contacts on another side of the board, performance may be improved.

18 Claims, 6 Drawing Sheets

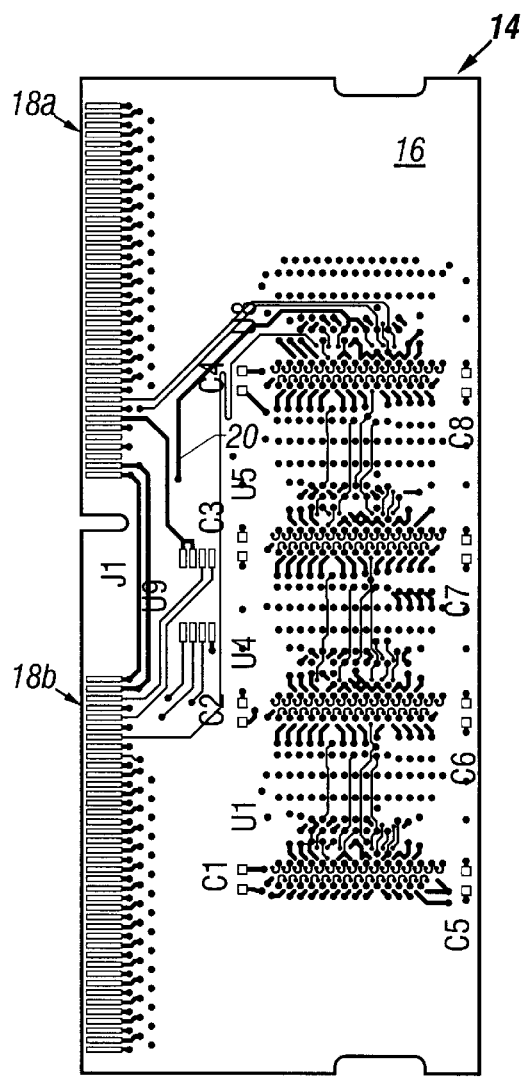 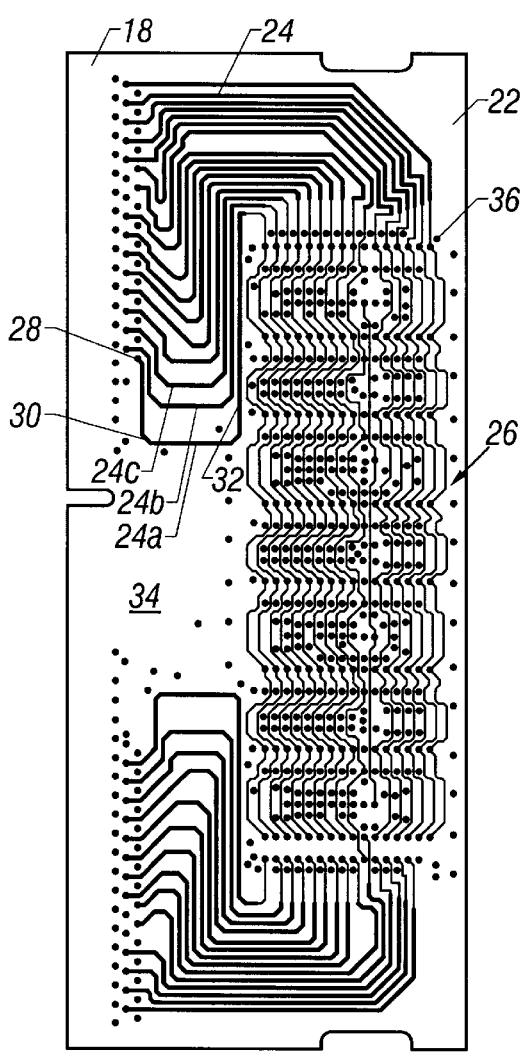
FIG. 2  FIG. 3

SMALL OUTLINE MEMORY MODULE

This is a continuation of prior application Ser. No. 09/221,804 filed Dec. 29, 1998, now U.S. Pat. No. 6,061,263.

BACKGROUND

This invention relates generally to memory modules which may act as system memory, for example, in connection with computer systems.

Rambus Dynamic Random Access Memory (RDRAM) currently offers sustained transfer rates of around 1,000 Mbps compared to 200 Mbps for ordinary DRAM memories. RDRAM may be used, for example, as the main or system memory in computer systems.

The Rambus In-line Memory Module or RIMM is a plug-in memory module for computer main memories. The RIMM may comply with the standards for the dual in-line memory modules (DIMM) form factor, but may not be pin compatible with the DIMM standards. A RIMM may implement the direct Rambus channel high speed bus which may operate at, for example, 400 megahertz.

A RIMM for the desktop computer applications may use traditional printed circuit board (PCB) routing techniques. However, the small outline version of the RIMM for laptop (SO-RIMM), or portable computers is considerably smaller than the RIMM used for desktop computers. According to current specifications of Rambus, Inc., as an example only, the desktop RIMM is 7.22 square inches while the laptop or portable version is 2.79 square inches.

This reduction in real estate available on the RIMM for portable applications complicates the SO-RIMM design. One design complication arises from providing the necessary route length for impedance matching. In addition, a problem may arise with RIMM modules that use an edge connector which extends along one edge of the PCB forming the RIMM. The integrated circuit Rambus memory chips themselves may be distributed along the length of the RIMM PCB. Thus, the routes must extend from the edge connector and turn through a relatively narrow turning region between the memory chips and the edge connector so as to extend around the memory chips to communicate with those chips.

Since the various routes are desirably matched in length, for impedance reasons, the narrow turning region provides a design constraint in designing for portable computer applications.

Thus, there is a need for an improved way of designing memory modules for portable and other reduced board area applications.

BRIEF DESCRIPTION OF THE DRAWING

FIG. 2 is a top plan view of the outside surface of an SO-RIMMs;

FIG. 3 is a top plan view of one of the layers of the RIMM shown in FIG. 2;

DETAILED DESCRIPTION

Figure 1:
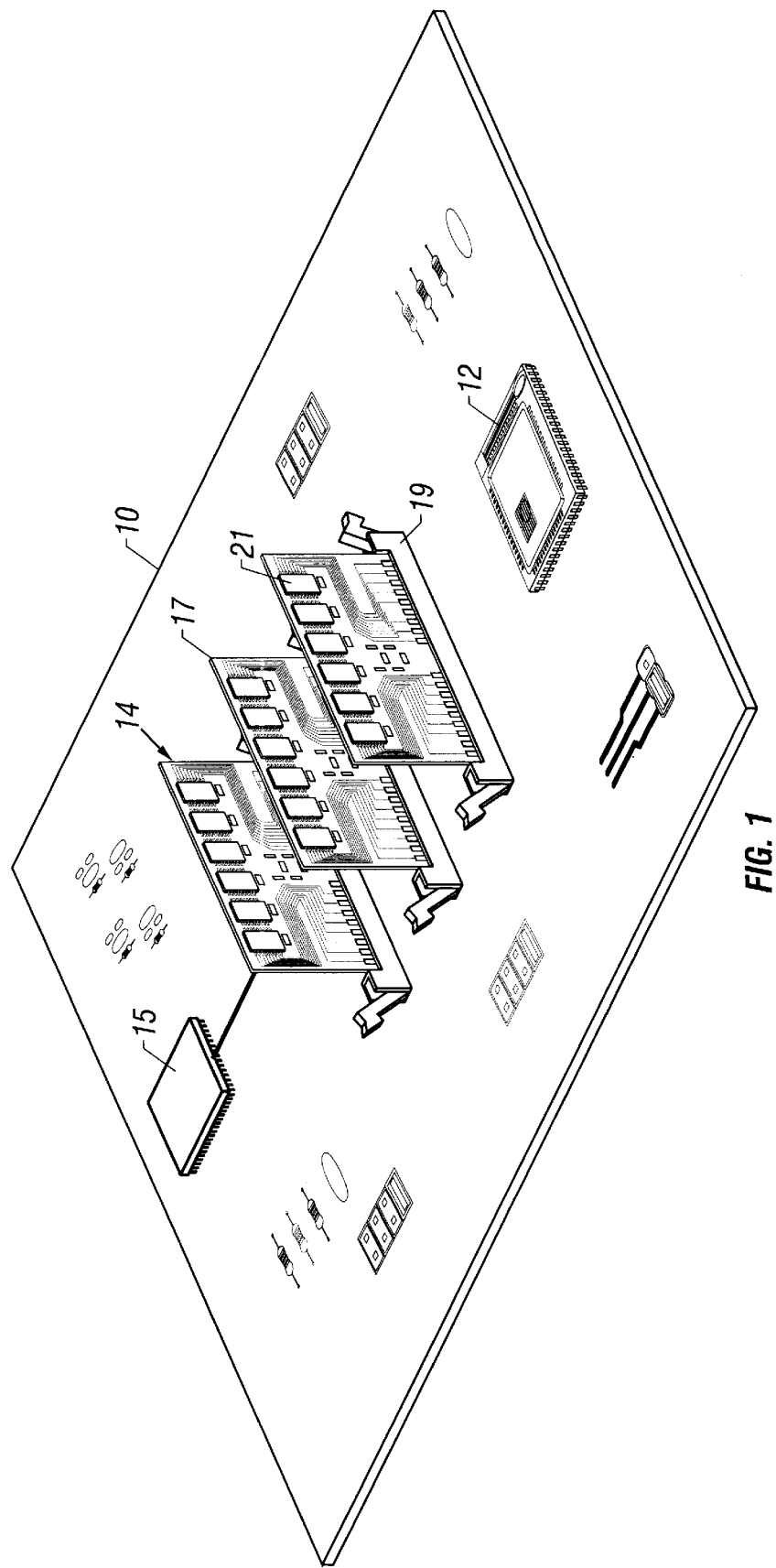
FIG. 1 is a perspective view of a motherboard.

Referring to FIG. 1, a motherboard 10 for a computer system may include a plurality of electronic components such as a processor 12 and a plurality of in-line memory modules 14 coupled to a memory controller 15. The in-line memory modules may be Rambus in-line memory modules (RIMMs). The motherboard 10 may be adapted for use with a portable computer system. A portable computer system is a computer system of reduced size (compared to a desktop computer system) that may operate on battery power. Each RIMM includes a board 17 and an edge connector contacts 18. The board 17 mounts the integrated circuit Rambus memory chips 21.

As shown in FIG. 2, a first layer 16 may form one outer side of a board 17. The layer 16 may include edge connector contacts 18, in one embodiment of the invention, that extend along the length of the board 17. The contacts 18 couple the board 17 to the edge connector 19. In fact, the edge connector contacts 18 may include two portions 18a and 18b, extending along the length of the board 17. A plurality of electronic components indicated by the designators U1, U5, U4 and C1 through C8 may be attached to the board 17 using conventional PCB techniques.

Conductors, traces, lines or routes 20 may extend from the edge connector contacts 18 to the electronic components including the chips 21. Conventionally, a plurality of integrated circuit Rambus memory chips may be secured to a PCB so that communication may occur between the edge connector 19 and the memory chips 21.

Referring to FIG. 3, in accordance with one embodiment of the invention, the next layer within the board 17 is the layer 22 which may be spaced from the layer 16 by a dielectric material. The layer 22 may also include a plurality of routes 24 that may extend from the edge connector contacts 18 to the region, indicated as 26, where the memory chips 21 are mounted.

A plurality of the routes 24 use "wrong-way" routing. For example, the route 24a starts at the contact 28 and extends in a first direction parallel to the length of the edge connector contacts 18. At region 30, the route 24a turns and at region 32, the route 24a extends back in the same direction, re-traversing the same area that it traversed between the contact 28 and the region 30. This type of routing is referred to as "wrong-way" routing and involves causing the route to extend along the length of the RIMM, parallel to the edge connector for a distance and then turning back in the opposite direction.

Wrong-way routing may occur in the narrow turning region 34 of the RIMM which is a region of reduced available space in reduced area RIMM boards such as are used with portable computers. The region 30 may be defined by the edge connector contacts 18 and the region 26 used to mount the memory chips.

The routes 24 extend through this region 34 from the edge connector contacts 18 to the bank of contacts 36. Thus, many of the routes extend across the region 34 in one direction, turn, and then extend in the opposite direction to come around the side of the chips to contact the contacts 36. With wrong-way routing, the routes, which need to go up in FIG. 3, actually first go down, then go up and then come around to contact the contacts 36.

Wrong-way routing may advantageously allow the propagation delay of the sets of routes in a given layer to be matched by suitable length adjustments, improving the performance of the RIMM. At the same time, wrong-way routing may facilitate the routing of the routes through the narrow turning region.

Due to the nature of the signals on a RIMM 14, in one embodiment of the invention, a large gap may be used between the various signals and the propagation delay of routes is advantageously substantially equal. The thickness of the dielectric material between the layers 14 and 22, for example, may be approximately 0.005 inches to narrow the trace width of the routes. However, varying the thickness of the dielectric between the routes may also vary the propagation delay of the routing.

Conventional serpentine routing for length matching may be disadvantageous in some embodiments because of the narrow turning region 34 that the routes traverse. Even though serpentine routing is an accepted approach to line lengthening, the density required by the portable RIMM board geometry makes wrong-way routing advantageous. wrong-way routing, in association with the short routes, may achieve added length given the small available area. Starting the route to the right (when needing to go left) and curving around, allows considerable length to be added to the shorter routes. Avoiding serpentine routing may decrease the number of turns that the signal follows, which may improve signal integrity.

Once half of a module 14 is routed, it may be mirrored to the other half. Actually, the routing for one quarter of a module can be copied to the other quadrants with some modifications of the routing.

Figure 4:
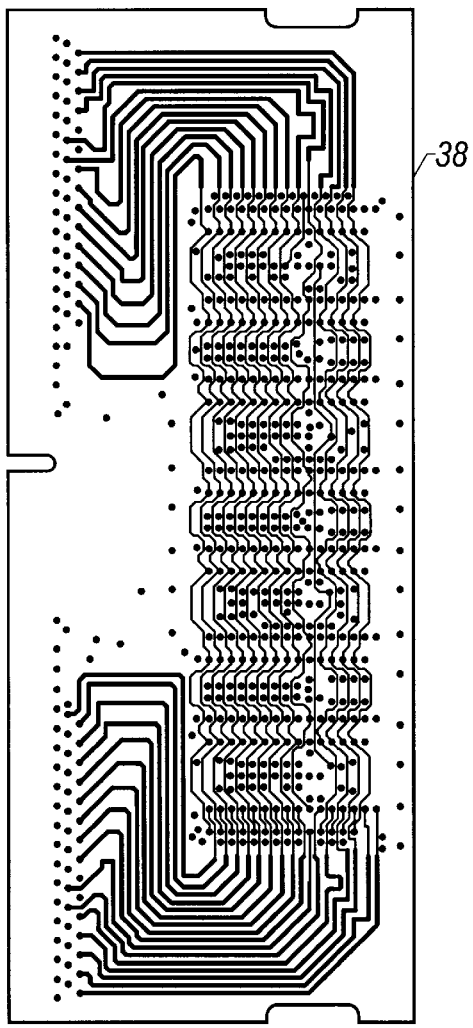
FIG. 4 is a top plan view of another of the layers of the RIMM shown in FIG. 2.
Figure 5:
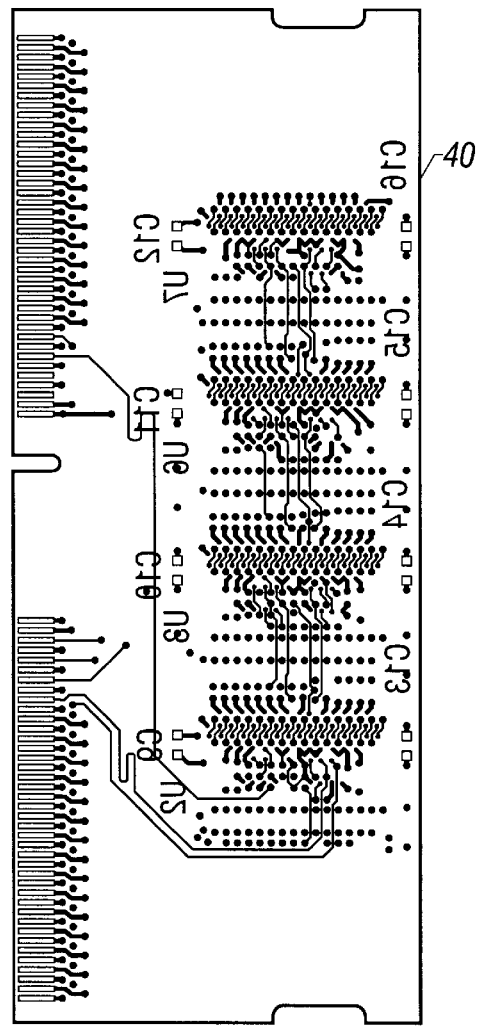
FIG. 5 is a top plan view of the side of the RIMM, opposite the side shown in FIG. 2.

The layer 38, shown in. FIG. 4, is situated below the layer 22. The exposed layer 40 of the RIMM 14, opposite the side shown in FIG. 2, is shown in FIG. 5.

Figure 7:
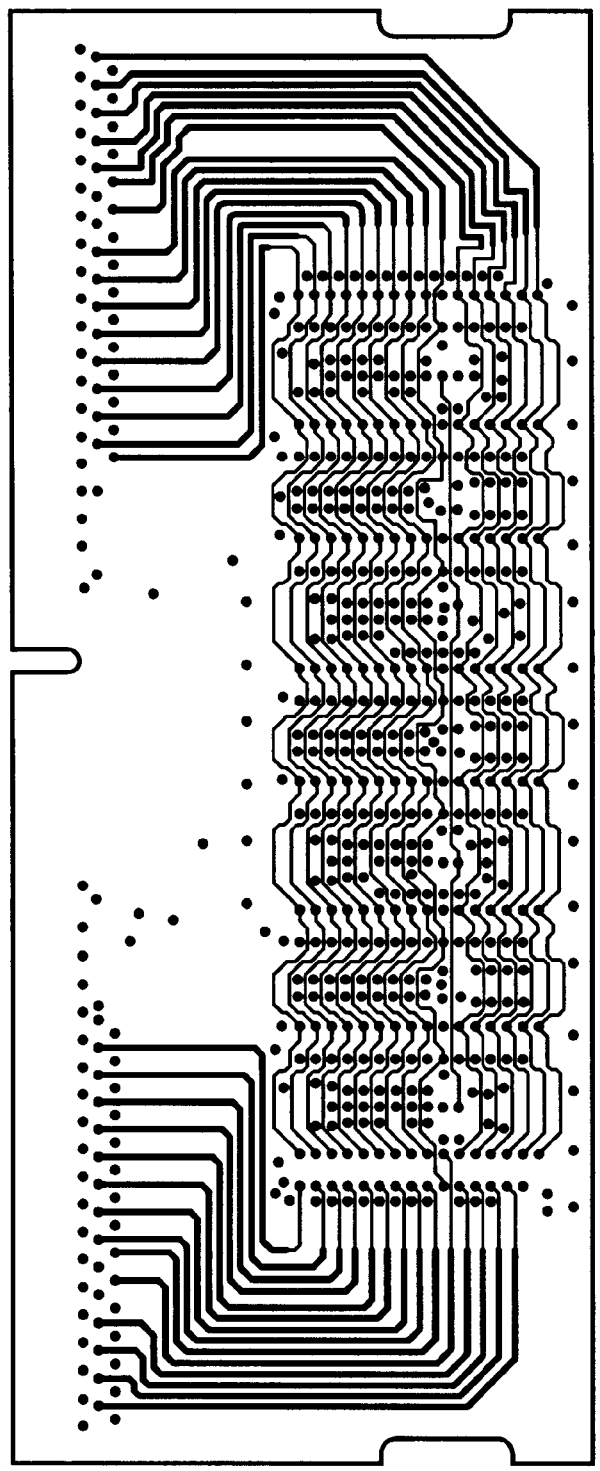
FIG. 7 is a top plan view illustrating how the routing illustrated in FIGS. 2 through 7 might have been attempted using prior art techniques.

If serpentine routing had been used, in accordance with prior art techniques, instead of wrong-way routing, the routes corresponding to the conductors 24a, 24b and 24c would simply extend across the region 34 and turn around, as illustrated in FIG. 7. The routing shown in FIG. 7, (merely to illustrate the difference from prior art technique) may not achieve matching of the routing lengths. Therefore, a more elaborate serpentine pattern would need to be used but the available real estate does not readily permit such an approach.

In some embodiments, the outer layers such as the layers 16 and 40 may have a lower propagation delay time. Therefore, signals may move faster on these layers. Thus, the longest routes may be routed on the outer layers, shortening the overall delay.

Figure 6:
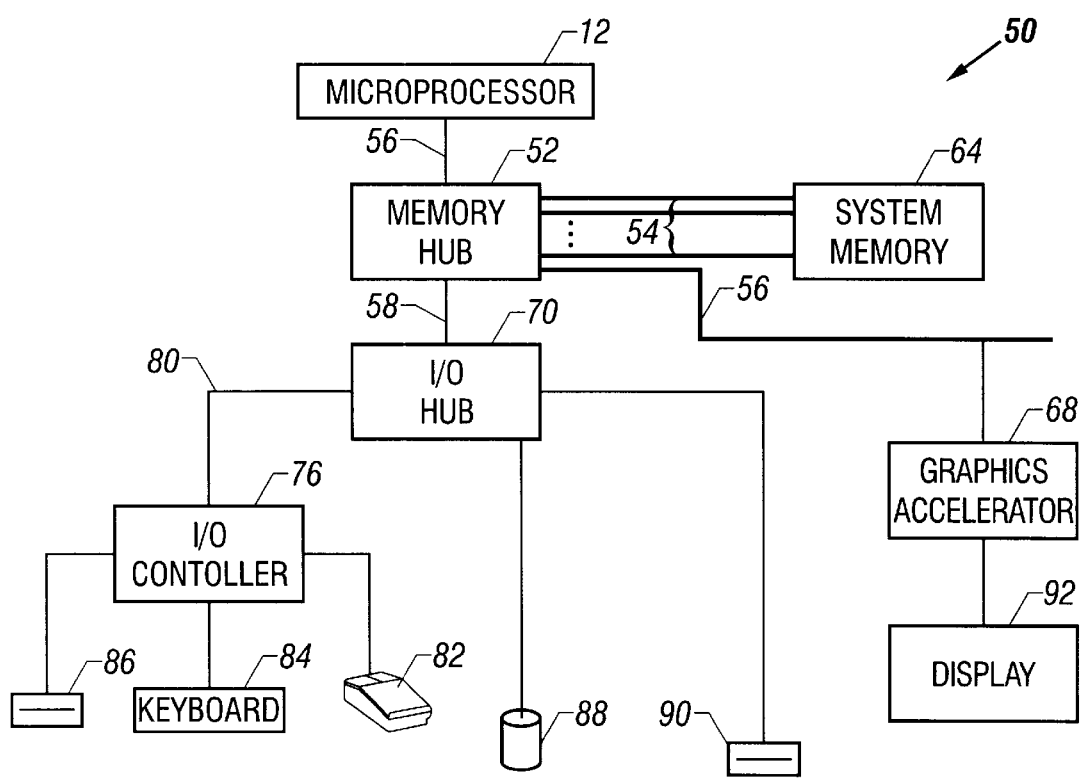
FIG. 6 is a block diagram showing an example of a computer system for implementing one embodiment of the present invention.

Referring now to FIG. 6, an embodiment of a computer system 50 in accordance with one embodiment of the invention, includes a memory hub bridge circuit 52, which may include interfaces for a memory bus 54, a microprocessor bus 56, and an accelerated graphics port (AGP) 56 and a hub link 58. AGP is described in the Accelerated Graphics Port Interface Specification, Revision 1.0, published Jul. 31, 1996, by Intel Corporation, Santa Clara. In this manner, the bridge circuit 52 may receive data from any one of the above described interfaces, and in response, the bridge circuit 52 may route the received data to another one of the interfaces.

The computer system 50 may also include a microprocessor 12 that may be coupled to the bridge circuit 52 by the processor bus 56. A system memory 64 may be coupled to the bridge circuit by the memory bus 54. The system memory 64 may be comprised of the RIMMs 14 and memory controller 15 shown in FIG. 1. A graphics accelerator 68 may be coupled by the AGP 56 to the bridge circuit 52. An input/output bridge circuit 70 may be coupled to the bridge circuit 52 by the hub link 58.

The bridge circuit 70 may provide an I/O interface for an I/O controller 76. The I/O controller 76 may be interfaced to the bridge circuit 70 by, for example, a bus 80 and the disk controller 78 may be interfaced to the bridge circuit 70 by, for example, another bus 74. The I/O controller may receive inputs from a mouse 82 and a keyboard 84. The I/O controller may also control operations of a floppy disk drive 86. The hub 70 may, for example, also control operations of a hard disk drive 88 and a compact disc read only memory (CD-ROM) drive 90. The graphics accelerator 68 may control operations of a display 92.

Figure 8:
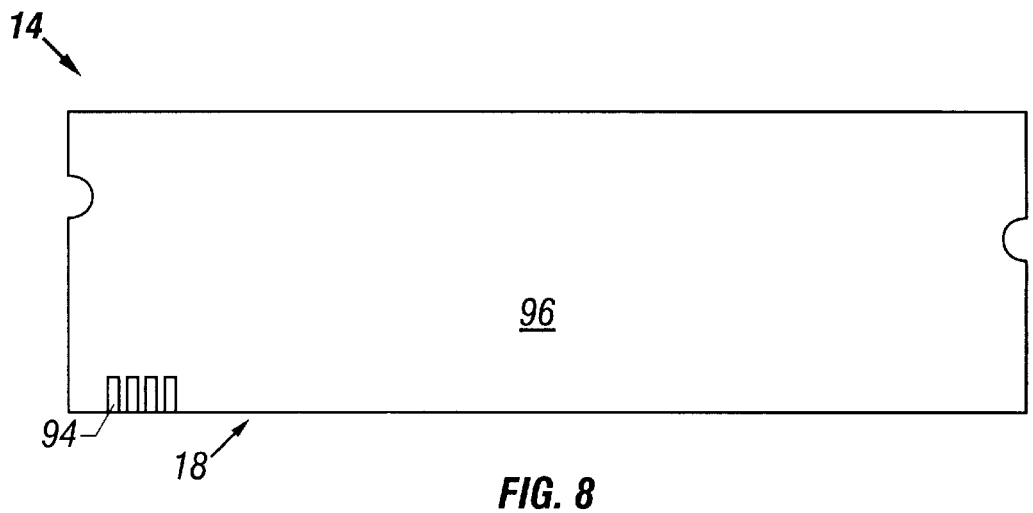
FIG. 8 is a top plan view of another embodiment of the invention.
Figure 9:
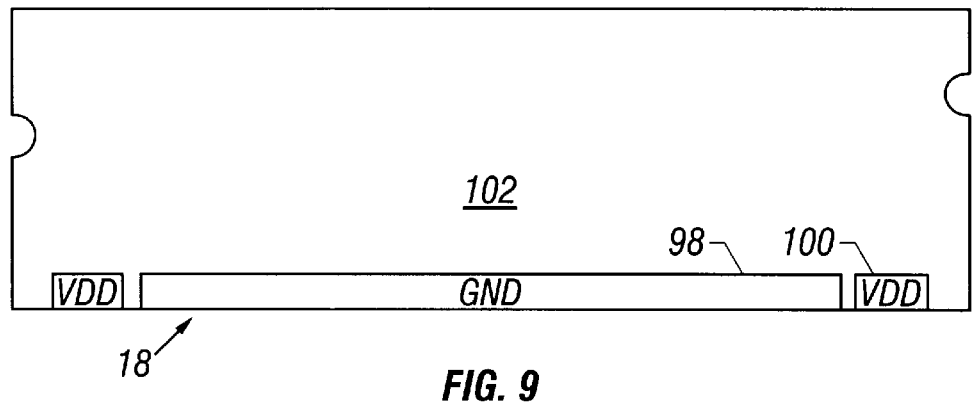
FIG. 9 is a bottom plan view of the embodiment shown in FIG. 8.

In accordance with another embodiment of the invention, signal lines and contacts 94 may be routed on one outer side 96 of the RIMM 14, in a common layer and the ground 98 and power supply lines and contacts 100 may be located in another layer 102 on the opposite side of the RIMM 14, as illustrated in FIGS. 8 and 9.

The various signals, which connect to the edge connector contacts 94, may be provided in an organization which differs from their pre-numbered sequence of conventional Rambus usage. For example, in conventional Rambus implementations, various signals are arranged consecutively in a predetermined pattern. The contacts associated with these signals are normally associated with one another in a sequential fashion as well. By mixing the arrangement of the pins to achieve an improved routing configuration, the performance of the RIMM may be improved.

Moving the signals to the same side of the RIMM offers signal integrity and routing advantages. Locating the signals on one side may lessen the significance of the differences in inductance between pins on the top and bottom of the RIMM. With this arrangement, the inductance difference arises between signal and ground only, which simplifies the design of the connector and also simplifies routing.

Having the signals on both sides of the connector may involve routing on one side of the RIMM board to compensate for differences introduced by the connector. Having all of the active signals on the same side of the RIMM may simplify the connector and may potentially save design time. By rearranging the order of the signals around the connector, the form factor may be reduced while the routing complexity may be lessened.

One example of a pin out layout to improve routing is illustrated as follows:

| Pin | Pin Name | Pin | Pin Name |
|---|---|---|---|
| 1 | SPD_CLK | 38 | DQB1_R |
| 2 | SPD_DATA | 39 | DQB2_R |
| 3 | SCK | 40 | DQB3_R |
| 4 | SIO0 | 41 | DQB4_R |
| 5 | DQA0_L | 42 | DQB5_R |
| 6 | DQA1_L | 43 | DQB6_R |
| 7 | DQA2_L | 44 | DQB7_R |
| 8 | DQA3_L | 45 | DQB8_R |
| 9 | DQA4_L | 46 | RQ0_R |
| 10 | DQA5_L | 47 | RQ1_R |
| 11 | DQA6_L | 48 | RQ2_R |
| 12 | DQA7_L | 49 | RQ3_R |
| 13 | DQA8_L | 50 | RQ4_R |

-continued

| Pin | Pin Name | Pin | Pin Name |
|---|---|---|---|
| 14 | CFM# | 51 | RQ5_R |
| 15 | CFM | 52 | RQ6_R |
| 16 | CTM# | 53 | RQ7_R |
| 17 | CTM | 54 | CTM |
| 18 | RQ7_L | 55 | CTM# |
| 19 | RQ6_L | 56 | CFM |
| 20 | RQ5_L | 57 | CFM# |
| 21 | RQ4_L | 58 | DQA8_R |
| 22 | RQ3_L | 59 | DQA7_R |
| 23 | RQ2_L | 60 | DQA6_R |
| 24 | RQ1_L | 61 | DQA5_R |
| 25 | RQ0_L | 62 | DQA4_R |
| 26 | DQB8_L | 63 | DQA3_R |
| 27 | DQB7_L | 64 | DQA2_R |
| 28 | DQB6_L | 65 | DQA1_R |
| 29 | DQB5_L | 66 | DQA0_R |
| 30 | DQB4_L | 67 | SIO2 |
| 31 | DQB3_L | 68 | SCMD |
| 32 | DQB2_L | 69 | SPD_AD1 |
| 33 | DQB1_L | 70 | SPD_AD0 |
| 34 | DQB0_L | A | VDD |
| 35 | V_TT | B | GND |
| 36 | V_REF | C | VDD |
| 37 | DQB0_R | | |

With this pin out definition, routing can be divided into sections on each side of the RIMM. In each section, a routing pattern may be developed. Using routing patterns and matching length techniques, the pin definition may allow the shortest length routing on the module. This may equate to smaller form factors for the module. Thus, a smaller form factor may be achieved with higher routing density.

While the present invention has been described with respect to a limited number of embodiments, those skilled in the art will appreciate numerous modifications and variations therefrom. It is intended that the appended claims cover all such modifications and variations as fall within the true spirit and scope of the present invention.

What is claimed is:

1. A memory module comprising:
   a board including a connector;
   an integrated circuit memory mounted on said board; and
   a plurality of routes extending over said board to said memory, said routes extending from said connector in a first direction away from said memory and then turning back and extending toward said memory.

2. The module of claim 1 wherein said module is a module for a portable computer.

3. The module of claim 1 wherein the signals are on one side of said board and ground is on the opposite side.

4. The module of claim 3 wherein power supply contacts are all on the opposite side of the board from said signals.

5. The module of claim 1 wherein said board includes a turning region between said memory and said connector, said routes extending through said turning region.

6. The module of claim 1 wherein said board includes a pair of opposed outer layers and the longest routes are located on said outer layers.

7. The method of claim 1 wherein said module is a Rambus in-line memory module.

8. A computer system comprising:
   a processor; and
   an integrated circuit memory module coupled to said processor, said module including routes arranged using wrong-way routing.

9. The system of claim 8 wherein said computer system is a portable computer.

10. The system of claim 8 including signals and ground contacts, and said module including two opposed sides wherein the signals are on one side of said module and the ground contacts are on the opposite side of said module.

11. The system of claim 10 including power supply contacts, wherein said power supply contacts are all on the opposite side of the module from said signals.

12. The system of claim 8 wherein said module includes routes, a turning region, an edge connector and memory chips, said turning region being situated between said memory chips and said connector, said routes extending through said turning region.

13. The system of claim 12 wherein said module includes a pair of opposed outer layers and the longest routes are located on said outer layers.

14. The system of claim 8 wherein said memory module is a Rambus in-line memory module.

15. A method comprising:
   locating an integrated circuit memory on a board;
   arranging contacts along an edge of a board so as to reduce the routing length; and
   arranging all of the signal routes on one side of the board extending between said memory and said contacts.

16. The method of claim 15 further including arranging all of the ground routes on an opposite side of the board.

17. The method of claim 16 further including arranging all of the power supply contacts on the side of the board with the ground routes.

18. The method of claim 15 further including using wrong way routing.

* * * * *